Oct. 14, 1958 H. C. LIN 2,856,520

OSCILLATOR USING POINT CONTACT AND JUNCTION TRANSISTORS
FOR IMPROVED FREQUENCY STABILITY

Filed April 30, 1954

INVENTOR.
Hung C. Lin
BY
H. D. Newton
ATTORNEY

United States Patent Office 2,856,520

Patented Oct. 14, 1958

2,856,520

OSCILLATOR USING POINT CONTACT AND JUNCTION TRANSISTORS FOR IMPROVED FREQUENCY STABILITY

Hung C. Lin, Levittown, Pa., assignor to Radio Corporation of America, a corporation of Delaware Application April 30, 1954, Serial No. 426,645

The terminal fifteen years of the term of the patent to be granted has been disclaimed 8 Claims. (Cl. 250—20)

This invention relates in general to electrical signal generator or oscillator circuits and in particular to such circuits in which semi-conductor devices are utilized as active signal translating and amplifying elements.

The recent development of commercially useful semi-conductor devices of the type employing a semi-conductive element having three contacting electrodes has already had a decided effect upon and has caused the introduction of many new techniques in the electrical signal communication field. These devices, which are known as transistors, are small in size, especially when compared with the ordinary vacuum tube, require no heater power, are very durable and consist of materials which appear to have a long useful life. Therefore, the use of transistors for oscillator, as well as other circuit applications has been the subject of extensive investigation.

Transistors, as is well known, are of two general classes which are known as the point-contact transistor and the junction transistor. Each of these classes is known to exhibit different characteristics which have made one class preferable to the other for certain circuit applications.

Semi-conductor oscillator circuits employing transistors of both the point-contact and junction type have been developed and are presently well known in the art. These circuits may be connected to operate in any of a number of ways depending primarily on the particular application for which the circuit was designed. Thus, oscillator circuits have been developed using an external feedback path between the input and output circuits of the transistor. If the energy which is fed back is of proper phase and amplitude, as is well known and understood, the normal circuit losses may be compensated for and sustained oscillation will be accomplished. In other oscillator circuits utilizing transistors, an external feedback path has been found to be unnecessary, sustained oscillation being accomplished by virtue of the particular electrical signal characteristics of the transistor used.

Many transistor oscillator circuits have been characterized to some extent by frequency instability. It has been found, for example, that the fundamental operating frequency of a transistor oscillator may vary with time for a single setting of the circuit components. These variations in the fundamental frequency may be result of variations in the source of operating bias potential. For most circuit applications, frequency instability of the oscillator is undesirable.

It is also well known that the amplitude of an oscillatory wave developed by a transistor oscillator circuit may be readily changed by impressing an alternating current modulation signal on the electrodes of the transistor. One of the difficulties encountered with such circuits is that the amplitude modulated output signal of the oscillator is also accompanied by undesired frequency modulation.

It is, accordingly, an object of the present invention to provide a semi-conductor oscillator circuit capable of generating a substantially frequency stable oscillatory wave.

It is a further object of the present invention to provide an oscillator circuit utilizing transistors which is capable of providing oscillatory energy which has a substantially constant frequency over a wide range of bias voltage supply variations.

It is yet another object of the present invention to provide an improved and low cost oscillation generator utilizing transistors which is stable and efficient.

It is a still further object of the present invention to provide a semi-conductor oscillation generator capable of producing a carrier wave of substantially constant frequency for amplitude modulation signal systems and the like.

These and further objects and advantages of the present invention are achieved, in general, by associating two semi-conductor devices having complementary effects on the frequency characteristics of the signal conveying circuit in which the devices are connected. The one semi-conductor device may be a junction transistor of one conductivity type. The other semi-conductor device may be a point-contact transistor of the same conductivity type as the junction transistor. In one aspect of the present invention the two transistors are effectively connected in parallel to provide a single oscillator circuit having a substantially constant frequency. In another aspect of the invention, the two transistors are connected in cascade, one serving as the active element of an oscillator circuit and the other as a signal mixer.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3:
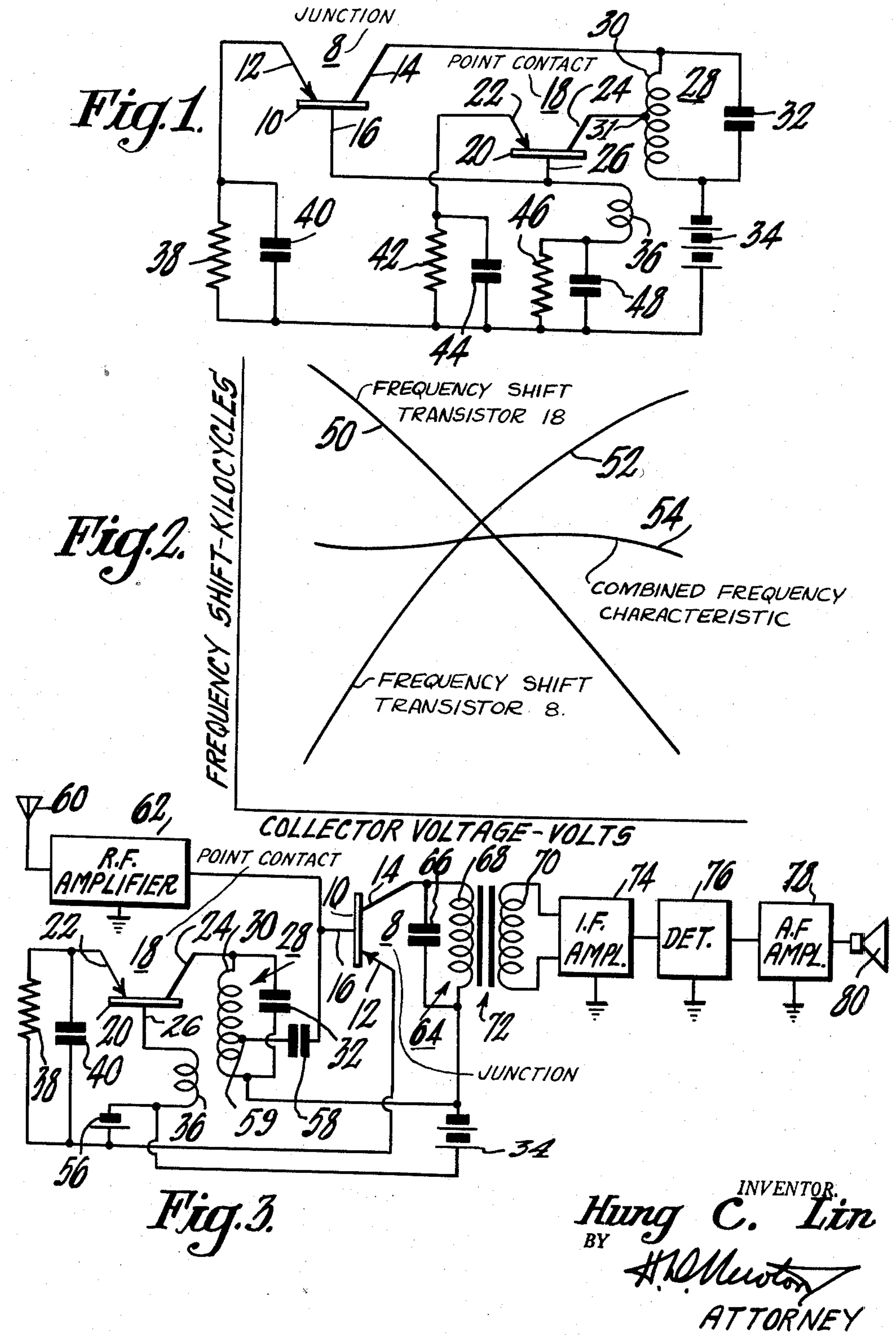
Figure 1 is a schematic circuit diagram of an oscillator utilizing a point-contact and a junction transistor in accordance with the invention.
Figure 2 is a graph showing curves relating frequency shift to collector voltage of various transistor oscillator circuits.
Figure 3 is a schematic circuit diagram partially in block form of a signal receiving system utilizing a transistor oscillator circuit and signal mixer in accordance with the invention.

Referring now to the drawing wherein like parts are indicated by like reference numerals throughout the figures, and referring particularly to Figure 1, a signal generator or oscillator circuit includes, in accordance with the invention, a pair of transistors 8 and 18 which are connected effectively in parallel as shown. The transistor 8 is of the junction type while the transistor 18 is of the point-contact type. Both transistors derive collector bias voltage from a single source of direct current voltage—such as illustrated by a battery 34. To this end, the transistors 8 and 18, while in general of different classes (i. e., point-contact and junction) should be of the same conductivity type. Accordingly, and by way of example, the transistor 8 is of the P–N–P junction type while the transistor 18 is of the N point-contact type.

It should be understood that the transistors 8 and 18 could both be of P type conductivity so long as the polarity of the biasing battery 34 is reversed. Moreover, the transistor 8 could be of the point-contact variety and the transistor 18 could be of the junction variety without departing from the scope of the present invention. Thus four different circuit arrangements using point-contact and junction transistors of different conductivity types are immediately apparent as follows:

| Transistor 8: | Transistor 18: |
|---|---|
| P–N–P junction | N point-contact |
| N–P–N junction | P point-contact |
| N point-contact | P–N–P junction |
| P point-contact | N–P–N junction |

As was pointed out hereinbefore, biasing voltages for the transistors 8 and 18 are provided by a battery 34. The negative terminal of this battery is connected through an inductor 30 of the oscillator tank or frequency determining circuit 28 to the collector 14 of the junction transistor 8. The oscillator tank circuit 28 includes in addition to the inductor 30 a capacitor 32 connected in parallel with the inductor 30 as shown. The negative terminal of the battery 34 is also connected through a portion of the inductor 30 and a tap 31 therefor to the collector 24 of the point-contact transistor 18. In addition, emitter biasing voltage for the transistor 8 is obtained by connecting the emitter 12 of that transistor through a resistor 38, which is by-passed for signal frequencies by a capacitor 40, to the positive terminal of the biasing battery 34. Similarly, the emitter 22 of the point-contact transistor 18 is connected through a resistor 42, which is by-passed by a capacitor 44 to the positive terminal of the biasing battery 34. Base biasing voltages and a feedback path for the oscillator circuit are obtained by connecting the base 16 of the junction transistor 8 to the base 26 of the point-contact transistor 18 and through a feedback coil or inductor 36 and a resistor 46 to the positive terminal of the biasing battery 34. The resistor 46 is by-passed for signal frequencies by a capacitor 48.

As thus described, the biasing will be recognized as proper for transistors of N-type conductivity. That is, the respective collector electrodes 14 and 24 of the transistors 8 and 18 are biased in the relatively non-conducting or reverse direction, each with respect to the base electrodes 16 and 26, respectively. In addition, the respective emitter electrodes 12 and 22 are referred to as being biased in the relatively conducting or forward direction, each with respect to the base electrodes 16 and 26, respectively.

The present invention is based on the fact that the frequency characteristics of point-contact and junction transistor oscillator circuits with collector voltage variations are complementary. This can be shown graphically, as in Figure 2, reference to which is now made. The curve 50 represents the frequency variations with collector voltage variations of a point-contact transistor oscillator. It is evident that as the collector voltage increases for the point-contact transistor oscillator there will be a corresponding and proportional decrease in the frequency. On the other hand, and in contradistinction to the point-contact transistor, the frequency of the junction transistor oscillator will increase as the collector voltage of the transistor is also increased. This is shown by the curve 52 in Figure 2. Thus, a point-contact and a junction transistor oscillator circuit may be referred to as having complementary frequency characteristics with collector voltage variations.

Since, as shown in Figure 1, both transistors derive their collector biasing voltage from the same biasing battery 34 they will both be subject to the same collector voltage variations. As shown by the curves 50 and 52 illustrated in Figure 2 of the drawing, these collector voltage variations cause rather large variations in the operating frequency of transistor oscillator circuits utilizing either point-contact and junction transistors alone. Hence, an oscillator circuit utilizing a single transistor of either the point-contact or junction type will be subject to frequency instability with collector voltage variations. By provision of the present invention, however, compensation for these frequency variations is achieved by utilizing the two different types of transistors at the same time in a signal generating circuit as shown in Figure 1. When thus combined, since the transistors exhibit complementary frequency characteristics, the frequency variations caused by one transistor will be compensated for by the opposite complementary frequency characteristics of the other transistor. This is shown by the curve 54 in Figure 2 which represents the frequency variations of a circuit of the type shown in Figure 1 with collector voltage variations. It is seen that the frequency of such a circuit is substantially constant over a wide range of collector voltage variations. In addition, by using two transistors as shown a larger output signal may be derived from the circuit than when a single transistor is utilized.

In operation, the parallel resonant or tank circuit 28 comprising the inductor 30 and the capacitor 32 determines the operating frequency of the oscillator circuit. Energy is fed back from the inductor 30 by means of the mutual coupling between it and the feedback inductor 36 to the base 16 of the first transistor 8. This feedback energy is provided in phase and magnitude, through the coupling shown, to overcome the losses in the circuit and thereby sustain continuous oscillation. By provision of the present invention these oscillations will be characterized by a substantially constant frequency over a wide range of collector voltage variations.

Moreover, by provision of the present invention, substantially constant frequency amplitude modulation of an oscillator circuit may be accomplished. Thus, a modulating voltage may be applied to the respective collectors 24 and 14, by, for example, connecting a modulating voltage source in series with the biasing battery 34. The frequency variations with the collector voltage variations of the point-contact and junction transistor due to the application of the modulating signal will then be the same as those illustrated by the curves 50 and 52 respectively in Figure 2. Since both transistors will have modulation signals applied to their respective collector electrodes from the same modulation source, they will both be subject to the same collector voltage variations. By utilizing the two different types of transistors, however, the frequency variations of one transistor will be compensated for by the complementary frequency characteristics of the other transistor. Hence, an amplitude modulated signal having a substantially constant frequency may be provided by the teachings of the present invention.

It is also possible, in accordance with this invention, to utilize one transistor as the active element of an oscillator circuit, and by suitable connections the other transistor may be used as a signal mixer. Such an application of the present invention is illustrated in Figure 3, reference to which is now made. In Figure 3, a superheterodyne signal receiver includes, in general, a pair of transistors 18 and 8, which correspond to the pair of transistors illustrated in Figure 1. The transistor 18 serves as the active element of an oscillator circuit while the transistor 8 serves as a signal mixer for the receiver. The receiver further includes an antenna 60, a radio frequency (R. F.) amplifier stage 62 which is coupled with the signal mixer, an intermediate frequency (I. F.) amplifier stage 74, a signal detector 76, an audio frequency (A. F.) amplifier stage 78, and signal reproducing means such as illustrated by a loudspeaker 80. These parts will be recognized as being the usual ones for superheterodyne signal receiving systems.

The base 26 of the transistor 18, which, as in Figure 1, is of the N type point-contact is connected through the feedback winding or inductor 36 to the negative terminal of a biasing battery 56. The emitter 22 of this transistor is connected through the resistor 38, which is by-passed by the capacitor 40, to the positive terminal of the biasing battery 56. The frequency determining or tank circuit 28 for the oscillator is connected with the collector 24 as shown.

Output oscillatory signals are coupled through a capacitor 58, which is connected through a tap 59 to the inductor 30, to the base 16 of the transistor 8 which serves as the signal mixer for the signal receiving system. The transistor 8, as in Figure 1, is a junction transistor of the P–N–P type, by way of example, and includes a tuned output circuit 64 which is connected with the collector 14 as shown. The output circuit 64 comprises an inductor 68, which is the primary winding of a coupling transformer 72, and a parallel capacitor 66.

As in Figure 1, collector biasing voltage for both transistors 8 and 18 is derived from a single source of direct current potential such as illustrated by a battery 34. To this end, the battery 34 has its negative terminal connected through the primary winding 68 of the coupling transformer 72 to the collector 14 of the transistor signal mixer 8, and its positive terminal connected with the lower end of the feedback winding 36 of the oscillator circuit. In addition, the negative terminal of the battery 34 is connected through the inductor 30 of the oscillator tank circuit 28 to the collector 24 of the transistor 18. The connections for the transistor 8 are completed by returning its emitter 12 to the positive terminal of the other biasing battery 56.

As was explained hereinbefore, and as can be seen from the curve 50 in Figure 2, the frequency of a point-contact transistor oscillator circuit decreases as the collector voltage increases. Moreover, it is known that the input capacity that exists between the base and emitter of a junction transistor will decrease as the collector voltage of the transistor is increased. Thus, in Figure 3, if it is assumed that the collector voltage which is derived from the biasing battery 34 is increasing, the frequency of the oscillatory energy developed by the oscillator circuit will decrease. At the same time, however, the identical collector voltage variations will appear on the collector 14 of the transistor 8—causing the input capacity which exists between the base 16 and emitter 12 of that transistor to also decrease. Accordingly, these decreases of capacity will appear across the tuned circuit 28 of the oscillator circuit causing the resonant frequency of that circuit to increase. Hence, the effects of collector voltage variations on the transistor mixer 8 will compensate for these effects on the oscillator frequency and substantially constant frequency oscillator signals may be coupled through the capacitor 58 to the base 16 of the transistor mixer 8.

In operation, the parallel resonant or tank circuit 28 comprising the inductor 30 and the capacitor 32 determines the operating frequency of the oscillator circuit. Energy is fed back from the inductor 30 by means of the mutual coupling between it and the feedback inductor 36 to the base 26 of the point-contact transistor 18. This feedback energy is provided in phase and magnitude, through the coupling shown, to overcome the losses in the circuit and thereby sustain continuous oscillation.

A received signal is amplified in the R. F. amplifier stage 62 and applied to the base 16 of the transistor mixer 8. The received signal is then heterodyned with the oscillator signal to produce a beat or intermediate frequency signal, whose frequency may be either the sum or the difference of the received signal and the oscillator signal. The intermediate frequency signal is then coupled through the transformer 72, the secondary winding 70 of which is connected with the I. F. amplifier stage 74, to that stage where it is amplified. The amplified intermediate frequency signal is then applied to the detector 76 where the received signal is separated from the modulation component. The resultant audio frequency signal is then amplified by the A. F. amplifying stage 78 and applied to the loudspeaker 80 for reproduction.

It should be understood that while N conductivity type transistors have been used to illustrate the embodiment of the present invention illustrated in Figure 3, P conductivity type transistors could be used equally well by reversing the polarity of the biasing batteries. It will be noted, moreover, that in this embodiment of the invention the transistor 8 is preferably of the point-contact variety while the transistor 18 is preferably of the junction variety. In addition, both transistors must be of the same conductivity type in order that they may derive their collector biasing voltage from a single source.

As described herein, frequency instability of semi-conductor oscillator circuits is prevented or minimized by the provisions of the present invention. Thus, an output signal which has a substantially constant frequency characterizes the improved oscillator circuits of the invention.

What is claimed is:

1. In an oscillator circuit, the combination comprising, a junction transistor and a point-contact transistor each including a semi-conductive body having a collector electrode and two other electrodes cooperatively associated therewith, a frequency determining tank circuit for said oscillator circuit including an inductor and a capacitor connected in parallel, conductive circuit means coupling the collector electrodes of said junction and point-contact transistors with said tank circuit, signal feedback means coupling said tank circuit with one of the other electrodes of ecah of said transistors and providing sustained oscillation of said oscillator circuit, means providing a source of direct current biasing voltage, and means including said inductor providing a direct current conductive path between said source and each of said collector electrodes to supply biasing voltages thereto, said point-contact and junction transistors being characterized by complementary frequency characteristics with respect to variations of said biasing voltages whereby collector voltage variations on the point-contact transistor are effective to compensate for the effects of collector voltage variations on the junction transistor and to provide frequency stabilization for said oscillator circuit.

2. In a signal translating circuit, the combination comprising, a signal oscillator circuit including a point-contact transistor having base, emitter and collector electrodes, a frequency determining circuit connected with said collector electrode and including an inductor and a capacitor connected in parallel, signal feedback means coupling said frequency determining circuit with said base electrode and providing sustained oscillation of said oscillator circuit, signal mixing means including a junction transistor having base, emitter and collector electrodes, conductive means including a portion of said inductor coupling the collector electrode of said point-contact transistor with the base electrode of said junction transistor, means providing a source of direct current biasing voltage connected with and operative to provide biasing voltages for the collector electrodes of said transistors, and means connecting the emitter electrode of said junction transistor with the emitter electrode of said point-contact transistor, said junction transistor being effective to compensate for the effect of collector voltage variations on said point-contact transistor to provide frequency stabilization for said oscillator circuit.

3. A signal translating circuit as defined in claim 2 wherein said point-contact transistor and said junction transistor are of the same conductivity type.

4. An oscillator circuit comprising, in combination, a first transistor including base, emitter, and collector electrodes, said first transistor being connected as the active amplifying element of said oscillator circuit and providing variations in frequency in one sense as the collector voltage thereof is varied, a second transistor including base, emitter, and collector electrodes, said second transistor providing variations in frequency of said oscillator circuit in an opposite sense at the collector voltage thereof is varied, said transistors providing complementary collector voltage-frequency characteristics of said oscillator circuit, means providing a common collector voltage supply source for said transistors, direct-current conductive means connecting said supply source with the collector electrodes of said first and second transistors and providing a direct-current conductive connection therebetween, and means including said direct-current conductive means coupling said first transistor with said second transistor to compensate for the frequency variations of said first transistor by the complementary frequency variations of said second transistor and providing a substantially constant frequency oscillator signal with variations in collector voltage of said first and second transistors.

5. An oscillator circuit comprising, in combination, a first transistor including base, emitter, and collector electrodes, said first transistor being connected as the active amplifying element of said oscillator circuit and providing variations in frequency in one sense as the collector voltage thereof is varied, a second transistor including base, emitter, and collector electrodes, said second transistor providing variations in frequency of said oscillator circuit in an opposite sense as the collector voltage thereof is varied, said transistors providing complementary collector voltage-frequency characteristics in said oscillator circuit, means providing a common collector voltage supply source for said transistors, direct-current conductive means connecting said supply source with the collector electrodes of said first and second transistors and providing a direct-current conductive connection therebetween, and means including said direct-current conductive means connecting said first and second transistors effectively in parallel to compensate for the frequency variations of said first transistor by the complementary frequency variations of said second transistor and providing a substantially constant frequency oscillator signal with variations in collector voltage of said first and second transistor.

6. An oscillator circuit comprising, in combination, a junction transistor including base, emitter, and collector electrodes, said junction transistor being connected as the active amplifying element of said oscillator circuit and providing increases in frequency as the collector voltage thereof is increased, a point-contact transistor including base, emitter, and collector electrodes, said point-contact transistor providing decreases in frequency of said oscillator circuit with increases in the collector voltage thereof, said transistors providing complementary collector voltage-frequency characteristics in said oscillator circuit, means providing a common collector voltage supply source for said transistors, direct-current conductive means connecting said supply source with the collector electrodes of said first and second transistors and providing a direct-current conductive connection therebetween, and means including said direct-current conductive means connecting said transistors in parallel to compensate for the frequency variations of said junction transistor by the complementary frequency variations of said point-contact transistor and providing a substantially constant frequency oscillator signal with variations in collector voltage of said transistor.

7. An oscillator circuit comprising, in combination, a first transistor including base, emitter, and collector electrodes, said first transistor being connected as the active amplifying element of said oscillator circuit and providing variations in frequency in one sense as the collector voltage thereof is varied, a second transistor including base, emitter, and collector electrodes, said second transistor providing variations in frequency of said oscillator circuit in an opposite sense as the collector voltage thereof is varied, said transistors providing complementary collector voltage-frequency characteristics in said oscillator circuit, means providing a common collector voltage supply source for said transistors, direct-current conductive means connecting said supply source with the collector electrodes of said first and second transistors and providing a direct-current conductive connection therebetween, and means including said direct-current conductive means connecting said transistors in cascade to compensate for the frequency variations of said first transistor by the complementary frequency variations of said second transistor and providing a substantially constant frequency oscillator signal with variations in collector voltage of said first and second transistors.

8. An oscillator circuit comprising, in combination, a point-contact transistor including base, emitter, and collector electrodes, said point-contact transistor being connected as the active amplifying element of said oscillator circuit and providing decreases in frequency as the collector voltage thereof is increased, a junction transistor including base, emitter, and collector electrodes, said junction transistor providing increases in frequency of said oscillator circuit as the collector voltage thereof is increased, said transistors providing complementary collector voltage-frequency characteristics in said oscillator circuit, means providing a common collector voltage supply source for said transistors, direct-current conductive means connecting said supply source with the collector electrodes of said first and second transistors and providing a direct-current conductive connection therebetween, and means including said direct-current conductive means connecting said transistors in cascade to compensate for the frequency variations of said point-contact transistor by the complementary frequency variations of said junction transistor and providing a substantially constant frequency oscillator signal with variations in collector voltage of said transistors.

References Cited in the file of this patent

UNITED STATES PATENTS

| | | |
|---|---|---|
| 2,647,957 | Mallinkrodt | Aug. 4, 1953 |
| 2,663,800 | Herzog | Dec. 22, 1953 |
| 2,666,819 | Raisbeck | Jan. 19, 1954 |
| 2,730,576 | Caruthers | June 10, 1956 |
| 2,759,104 | Skellett | Aug. 14, 1956 |